United States Patent
Choi

(10) Patent No.: US 10,115,729 B2
(45) Date of Patent: Oct. 30, 2018

(54) ANTI-FUSE NONVOLATILE MEMORY DEVICES EMPLOYING LATERAL BIPOLAR JUNCTION TRANSISTORS AS SELECTION TRANSISTORS

(71) Applicant: SK hynix Inc., Gyeonggi-do (KR)

(72) Inventor: Kwang Il Choi, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/247,646

(22) Filed: Aug. 25, 2016

(65) Prior Publication Data

US 2017/0271346 A1    Sep. 21, 2017

(30) Foreign Application Priority Data

Mar. 21, 2016 (KR) .................. 10-2016-0033104

(51) Int. Cl.
| | |
|---|---|
| H01L 27/112 | (2006.01) |
| H01L 27/102 | (2006.01) |
| H01L 29/08 | (2006.01) |
| H01L 29/735 | (2006.01) |
| H01L 23/525 | (2006.01) |
| H01L 29/94 | (2006.01) |

(52) U.S. Cl.
CPC .... *H01L 27/11206* (2013.01); *H01L 23/5252* (2013.01); *H01L 27/1026* (2013.01); *H01L 29/0808* (2013.01); *H01L 29/0821* (2013.01); *H01L 29/735* (2013.01); *H01L 29/94* (2013.01)

(58) Field of Classification Search
CPC ........... H01L 27/11206; H01L 23/5252; H01L 29/94; H01L 29/0808; H01L 29/0821; H01L 23/528; H01L 29/735; H01L 27/1022; H01L 27/1024; H01L 27/1026
See application file for complete search history.

(56) References Cited

U.S. PATENT DOCUMENTS

| | | | |
|---|---|---|---|
| 6,329,246 B1 | 12/2001 | Lee | |
| 7,157,782 B1* | 1/2007 | Shih | .................... H01L 27/0203 257/50 |
| 2006/0046354 A1* | 3/2006 | Kreipl | .................. H01L 27/112 438/132 |
| 2014/0231895 A1* | 8/2014 | Rothleitner | ......... H01L 29/4238 257/315 |

FOREIGN PATENT DOCUMENTS

KR    1020090120212    11/2009

* cited by examiner

*Primary Examiner* — Hoang-Quan Ho
(74) *Attorney, Agent, or Firm* — IP & T Group LLP

(57) ABSTRACT

An anti-fuse nonvolatile memory device includes an anti-fuse memory cell and a bipolar junction transistor. The anti-fuse, memory cell has a first terminal and a second terminal. The second terminal is coupled to a word line. The bipolar junction transistor has a collector terminal coupled to the first terminal of the anti-fuse, memory cell, a base terminal, and an emitter terminal coupled to a bit line.

5 Claims, 15 Drawing Sheets

ANTI-FUSE NONVOLATILE MEMORY DEVICES EMPLOYING LATERAL BIPOLAR JUNCTION TRANSISTORS AS SELECTION TRANSISTORS

CROSS-REFERENCE TO RELATED APPLICATIONS

The present application claims priority under 35 U.S.C 119(a) to Korean Patent Application No. 10-2016-0033104, filed on Mar. 21, 2016, which is herein incorporated by reference in its entirety.

BACKGROUND

1. Technical Field

Various embodiments of the present disclosure relate to nonvolatile memory devices and, more particularly, to anti-fuse nonvolatile memory devices employing lateral bipolar junction transistors as selection transistors.

2. Related Art

Nonvolatile memory devices retain their stored data even when their power supply is interrupted. Nonvolatile memory devices may include read only memory (ROM) devices, one-time programmable (OTP) memory devices and rewritable memory devices. Recently, nonvolatile memory devices have been realized by using advanced semiconductor memory techniques, for example, a complementary metal-oxide-semiconductor (CMOS) compatible process.

The OTP memory devices may be categorized as either fuse type OTP memory devices or anti-fuse type OTP memory devices. Each memory cell included in the fuse type OTP memory devices may provide a short circuit before it is programmed and an open circuit after it is programmed. In contrast, each memory cell included in the anti-fuse type OTP memory devices may provide an open circuit before it is programmed and a short circuit after it is programmed. In consideration of characteristics of the MOS transistors, the CMOS processes may be suitable for fabrication of the anti-fuse type OTP memory devices.

SUMMARY

Various embodiments are directed to anti-fuse nonvolatile memory devices employing lateral bipolar junction transistors as selection transistors.

According to an embodiment, an anti-fuse nonvolatile memory device includes an anti-fuse memory cell and a bipolar junction transistor. The anti-fuse, memory cell has a first terminal and a second terminal. The second terminal is coupled to a word line. The bipolar junction transistor has a collector terminal coupled to the first terminal of the anti-fuse, memory cell, a base terminal, and an emitter terminal coupled to a bit line.

According to another embodiment, there is provided an anti-fuse nonvolatile memory device including a plurality of anti-fuse memory cell units which are respectively located at cross points of a plurality of rows and a plurality of columns. Each of the anti-fuse memory cell units includes an anti-fuse memory cell and a bipolar junction transistor. The anti-fuse memory cell has a first terminal and a second terminal. The second terminal is coupled to a word line. The bipolar junction transistor has a collector terminal coupled to the first terminal of the anti-fuse memory cell, a base terminal, and an emitter terminal coupled to a bit line.

According to another embodiment, an anti-fuse nonvolatile memory device includes a well region of a first conductivity type, a plurality of active regions disposed in the well region, a plurality of gates disposed to intersect the plurality of active regions, anti-fuse insulation layers disposed between the plurality of gates and the plurality of active regions, and a plurality of lateral bipolar junction transistors disposed in the active regions. Each of the plurality of lateral bipolar junction transistors includes a collector region of a second conductivity type and an emitter region of the second conductivity type that are adjacent to a surface of the well region and to be spaced apart from each other by a portion of the well region.

BRIEF DESCRIPTION OF THE DRAWINGS

Various embodiments of an inventive concept will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define the element itself or to mean a particular sequence. In addition, when an element is referred to as being located "on", "over", "above", "under" or "beneath" another element, it is intended to mean a relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless specifically indicated otherwise.

Figure 1:
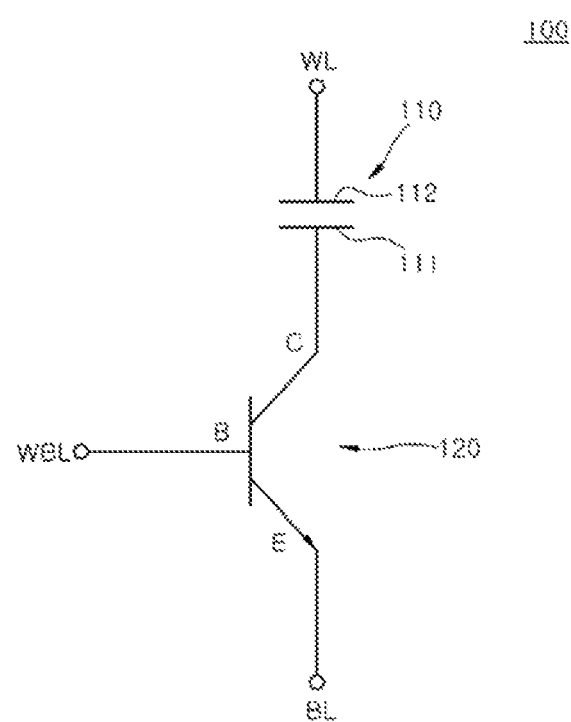
FIG. 1 is an equivalent circuit diagram illustrating an anti-fuse nonvolatile memory device, according to an embodiment of the present disclosure.

Referring now to FIG. 1, an equivalent circuit diagram of an anti-fuse, nonvolatile memory device 100 is provided according to an embodiment of the present disclosure. Accordingly, the anti-fuse, nonvolatile memory device 100 may be configured to include an anti-fuse memory cell 110 and a bipolar junction transistor (BJT) 120. In an embodiment, the anti-fuse memory cell 110 may be a metal-oxide-semiconductor (MOS) capacitor including a semiconductor region doped with impurities to constitute a first terminal 111, a gate used as a second terminal 112, and an anti-fuse insulation layer disposed between the semiconductor region that is, the first terminal 111 and the gate that is, the second terminal 112. The BJT 120 may be a lateral NPN BJT having a current path provided along a surface of a substrate. A base terminal B and an emitter terminal E of the BJT 120 may be electrically coupled to a well bias line WBL and a bit line BL, respectively. A collector terminal C of the BJT 120 may be electrically coupled to the first terminal 111 of the anti-fuse memory cell 110. The collector terminal C of the BJT 120 may not be directly coupled to any signal lines to have a floating status. The second terminal 112 of the anti-fuse memory cell 110 may be coupled to a word line WL.

Figure 2:
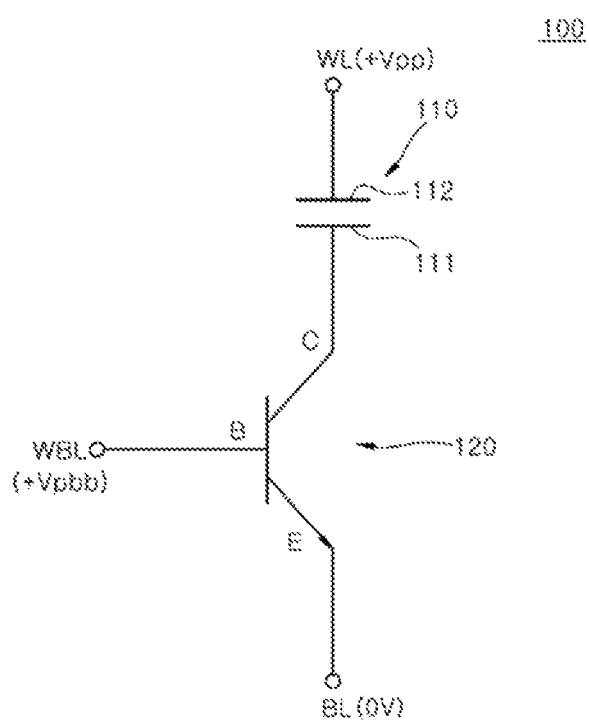
FIG. 2 is an equivalent circuit diagram illustrating a program operation of an anti-fuse nonvolatile memory device, according to an embodiment of the present disclosure.

FIG. 2 is an equivalent circuit diagram illustrating a program operation of the anti-fuse nonvolatile memory device 100 according to an embodiment of the present disclosure. In FIG. 2, the same reference numerals or designators as used in FIG. 1 denote the same elements. Referring to FIG. 2, for programming the anti-fuse nonvolatile memory device 100, a positive program voltage +Vpp may be applied to the word line WL and a positive program base voltage +Vpbb may be applied to the well bias line WBL. In addition, a ground voltage 0V may be applied to the bit line BL. That is, the bit line BL may be grounded. The positive program voltage +Vpp may induce the increase of a voltage level of the collector terminal C of the lateral BJT 120 to generate a reverse bias between the base terminal B and the collector terminal C of the lateral BJT 120 as well as to generate a collector current causing breakdown of the anti-fuse insulation layer. In an embodiment, the positive program voltage +Vpp may be approximately +6 volts. The positive program base voltage +Vpbb may have a voltage level which is capable of turning on a PN diode comprised of a base-emitter (B-E) junction of the lateral BJT 120. If the lateral BJT 120 is realized using a silicon material, the positive program base voltage +Vpbb may have a voltage level, which is higher than approximately +0.6 volts. In an embodiment, the positive program base voltage +Vpbb may have a voltage level of approximately +1 volts.

As the positive program base voltage +Vpbb is applied to the base terminal B of the lateral BJT 120 and the emitter terminal E of the BJT 120 is grounded, the base-emitter (B-E) junction of the lateral BJT 120 may be forward-biased. The positive program voltage +Vpp applied to the second terminal 112 of the anti-fuse memory cell 110 through the word line WL may boost the voltage level of the collector terminal C of the lateral BJT 120. If a voltage level of the collector terminal C of the lateral BJT 120 is boosted to become higher than the positive program base voltage +Vpbb, a base-collector (B-C) junction of the lateral BJT 120 may be reverse-biased. If the base-emitter (B-E) junction of the lateral BJT 120 is forward-biased and the base-collector (B-C) junction of the lateral BJT 120 is reverse-biased, the lateral BJT 120 may enter an active mode to generate a collector current. Some of the electrons causing the collector current may penetrate the anti-fuse insulation layer due to a tunneling mechanism, for example, a direct tunneling mechanism or a Fowler-Nordheim (F-N) tunneling mechanism. If an amount of a leakage current due to the tunneling electrons increases, the number of defects generated in the anti-fuse insulation layer may also increase to form conductive breakdown paths disposed between the first and second terminals 111 and 112 of the anti-fuse memory cell 110.

Figure 3:
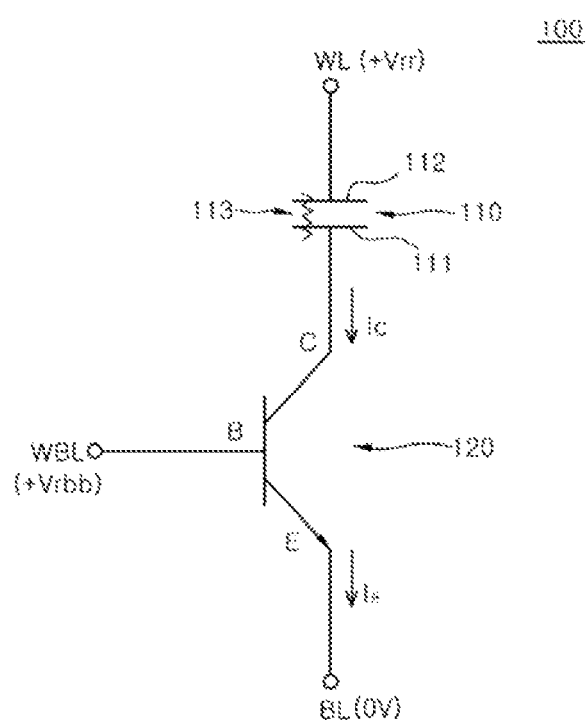
FIG. 3 is an equivalent circuit diagram illustrating a read operation of an anti-fuse nonvolatile memory device, according to an embodiment of the present disclosure.

FIG. 3 is an equivalent circuit diagram illustrating a read operation of the anti-fuse nonvolatile memory device 100, according to an embodiment of the present disclosure. In FIG. 3, the same reference numerals or designators as used in FIG. 1 denote the same elements. Referring to FIG. 3, for reading out information stored in the anti-fuse nonvolatile memory device 100, a positive read voltage +Vrr may be applied to the word line WL and a positive read base voltage +Vrbb may be applied to the well bias line WBL. In addition, a ground voltage 0V may be applied to the bit line BL. That is, the bit line BL may be grounded. The positive read base voltage +Vrbb may have a voltage level which is close to a turn-on voltage of a PN diode comprised of a base-emitter (B-E) junction of the lateral BJT 120. In an embodiment, if the lateral BJT 120 is realized using a silicon material, the positive read base voltage +Vrbb may be approximately +0.5 volts. The positive read voltage +Vrr may have a voltage level within a range of about 20% to about 30% of the positive program voltage +Vpp applied to the word line WL during the program operation to prevent the anti-fuse memory cell 110 from being programmed during the read operation. Moreover, the positive read voltage +Vrr may be higher than the positive read base voltage +Vrbb. Specifically, the positive read voltage +Vrr may have a voltage level which is capable of sufficiently increasing a base current of the lateral BJT 120 so that the PN diode comprised of the base-emitter (B-E) junction of the lateral BJT 120 is turned on. In an embodiment, the positive read voltage +Vrr may be approximately +1.5 volts.

The positive read voltage +Vrr applied to the second terminal 112 of the anti-fuse memory cell 110 through the word line WL may boost a voltage level of the collector terminal C of the lateral BJT 120. If the voltage level of the collector terminal C is boosted to become higher than a certain level for example, a voltage level of the positive read base voltage +Vrbb, to increase the base current of the lateral BJT 120, the PN diode comprised of the base-emitter (B-E) junction of the lateral BJT 120 may be turned on. In such a case, a current path may be provided between the collector terminal C and the emitter terminal E of the lateral BJT 120.

Under the read bias condition illustrated in FIG. 3, if the anti-fuse memory cell 110 is programmed to have a current path 113 between the first and second terminals 111 and 112 of the anti-fuse memory cell 110, a collector current IC may flow from the word line WL toward the collector terminal C of the lateral BJT 120 due to the presence of the current path 113 and an emitter current IE may flow from the emitter terminal E toward the bit line BL. In contrast, in the event that the anti-fuse memory cell 110 is not programmed to have an initial status without the current path 113, no current flows from the word line WL toward the bit line BL even though the anti-fuse nonvolatile memory device 100 is under the read bias condition. Accordingly, a status of the anti-fuse memory cell 110 may be read out by sensing the emitter current IE flowing through the bit line BL.

Figure 4:
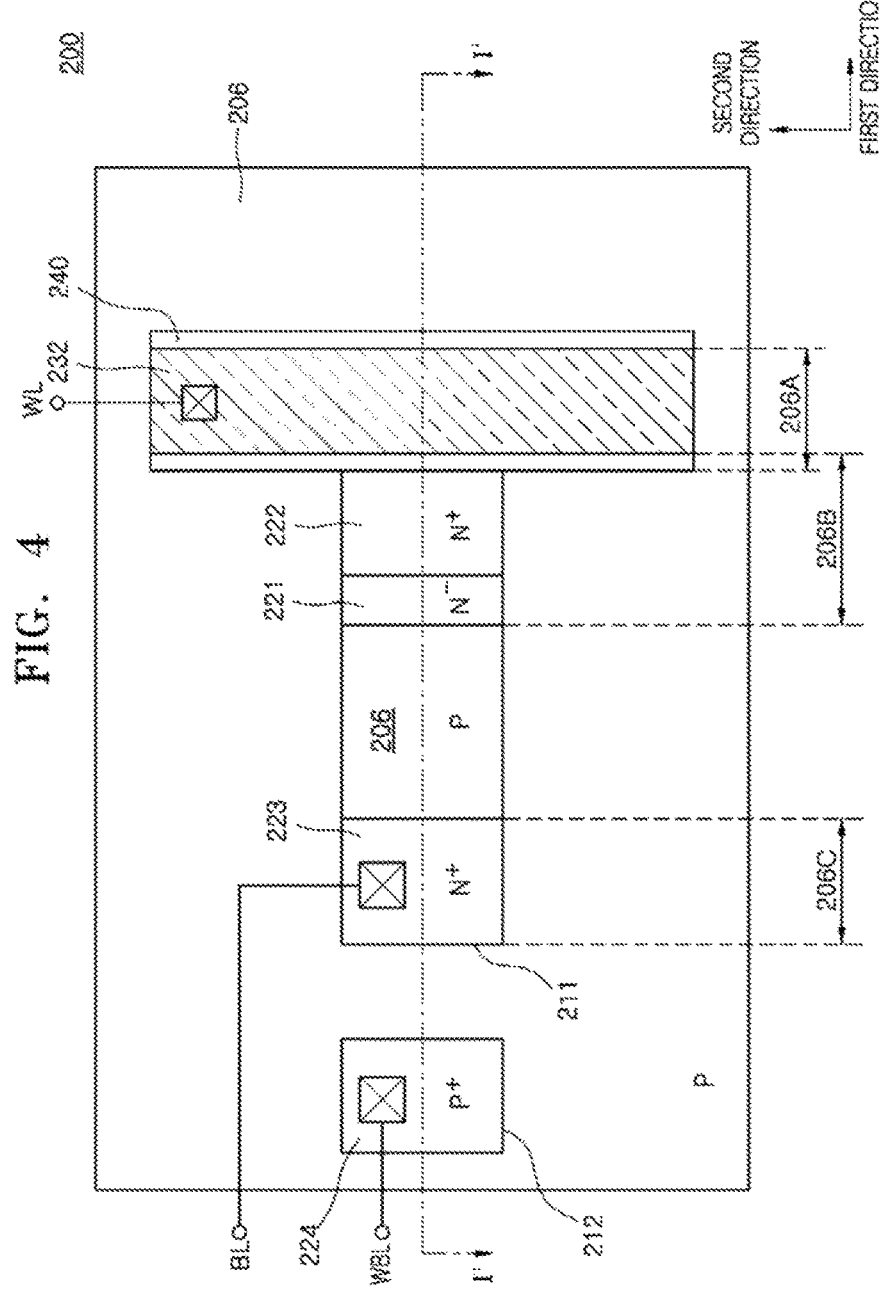
FIG. 4 is a layout diagram illustrating an anti-fuse, nonvolatile memory device, according to an embodiment of the present disclosure.
Figure 5:
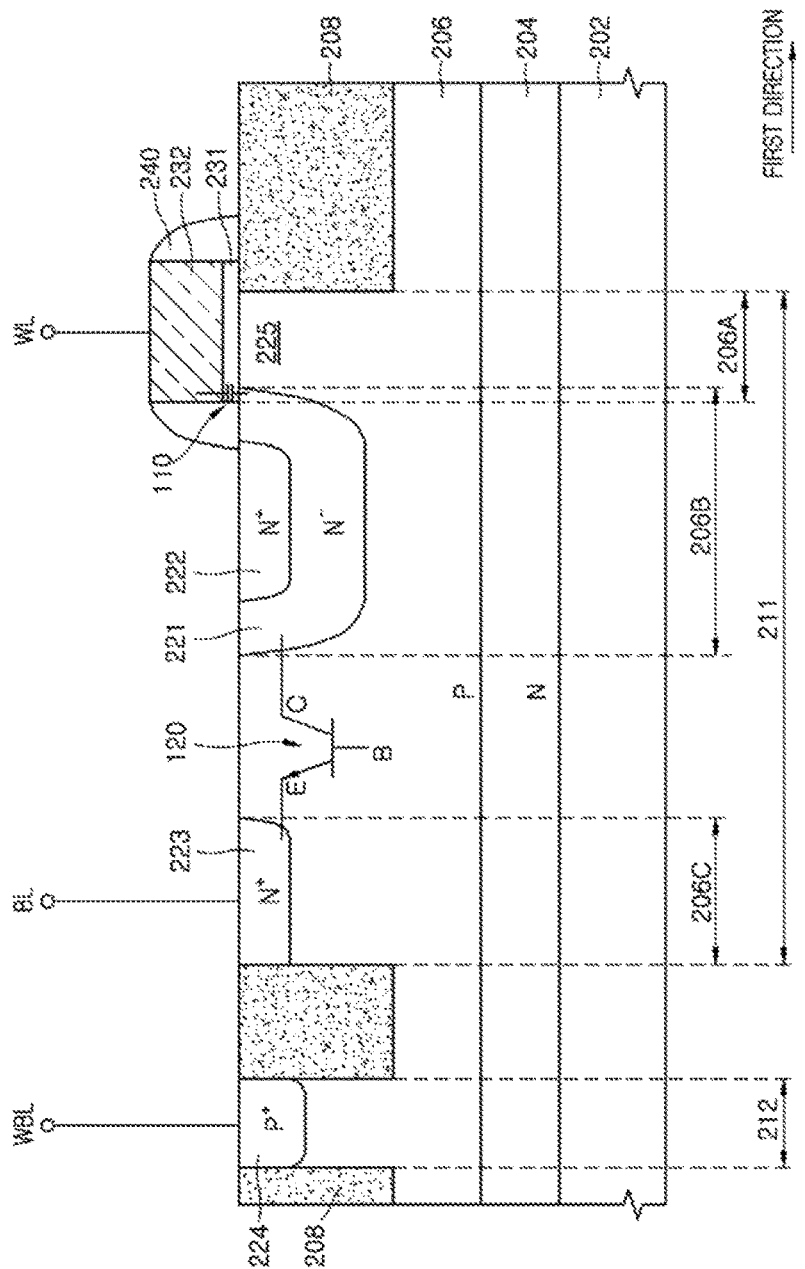
FIG. 5 is a cross-sectional view taken along a line I-I' of FIG. 4.

FIG. 4 is a layout diagram illustrating an anti-fuse, nonvolatile memory device 200, according to an embodiment of the present disclosure. FIG. 5 is a cross-sectional view taken along a line I-I' of FIG. 4. In FIG. 4, an isolation layer 208 of FIG. 5 is not illustrated. Referring to FIGS. 4 and 5, the anti-fuse, nonvolatile memory device 200 may be realized to include an N-type, deep well region 204 disposed on a substrate 202. A P-type well region 206 may be disposed on the N-type deep well region 204. The isolation layer 208 may define first and second active regions 211 and 212 which are disposed in an upper portion of the P-type well region 206. The first and second active regions 211 and 212 may be spaced apart from each other in a first direction FIRST DIRECTION. In an embodiment, the first active region 211 may have a stripe shape extending in the first direction, and the second active region 212 may have a box shape. An upper portion of the P-type well region 206 in the first active region 211 may include a first upper portion 206A, a second upper portion 206B and a third upper portion 206C which are arrayed in the first direction. The second upper portion 206B may be disposed between the first and third upper portions 206A and 206C. One end of the second upper portion 206B may overlap with one end of the first upper portion 206A. The third upper portion 206C may be spaced apart from the second upper portion 206B in the first direction.

A first N-type collector region 221 may be disposed in the second upper portion 206B of the P-type well region 206 located in the first active region 211. A second N-type collector region 222 may be disposed in an upper portion of the first N-type collector region 221. Since one end of the second upper portion 206B overlaps with one end of the first upper portion 206A, one end of the first N-type collector region 221 may also be located in the first upper portion 206A. In contrast, the second N-type collector region 222 may be disposed only in the second upper portion 206B. The first N-type collector region 221 may have an impurity concentration, which is lower than that of the second N-type collector region 222. In addition, the first N-type collector region 221 may have a junction depth which is greater than that of the second N-type collector region 222. The first and second N-type collector regions 221 and 222 may not be directly coupled to any signal lines to have a floating status. An N-type emitter region 223 may be disposed in the third upper portion 206C of the P-type well region 206 located in the first active region 211. In an embodiment, the N-type emitter region 223 may have substantially the same impurity concentration as the second N-type collector region 222. Moreover, the N-type emitter region 223 may have substantially the same junction depth as the second N-type collector region 222. The N-type emitter region 223 may be electrically coupled to the bit line BL. A P-type contact region 224 may be disposed in an upper portion of the P-type well region 206 located in the second active region 212. The P-type well region 206 may be electrically coupled to the well bias line WBL through the P-type contact region 224. The first N-type collector region 221, the P-type well region 206 and the N-type emitter region 223 may constitute the lateral NPN BJT (120 of FIGS. 1 to 3). In such a case, the P-type well region 206 between the first N-type collector region 221 and the N-type emitter region 223 may function as a base region of the NPN BJT.

An anti-fuse insulation layer 231 may be disposed on the first upper portion 206A of the P-type well region 206. In an embodiment, the anti-fuse insulation layer 231 may be comprised of an oxide type insulation material. A gate 232 may be disposed on the anti-fuse insulation layer 231. In an embodiment, the gate 232 may be comprised of at least one of a polysilicon material doped with impurities and a metal material. The gate 232 may be electrically coupled to the word line WL. An upper portion of the P-type well region 206 vertically overlapping with the anti-fuse insulation layer 231 and the gate 232 may be defined as a channel region 225. An insulation spacer 240 may be disposed on sidewalls of the anti-fuse insulation layer 231 and the gate 232. Since one end of the first upper portion 206A overlaps with one end of the second upper portion 206B, a sidewall of the anti-fuse insulation layer 231 and a sidewall of the gate 232 may be vertically aligned with an end of the second upper portion 206B. Thus, an end of the anti-fuse insulation layer 231 and an end of the gate 232 may vertically overlap with an end of the first N-type collector region 221. A stack structure including the first N-type collector region 221, the anti-fuse insulation layer 231 and the gate 232 may correspond to the anti-fuse memory cell (110 of FIGS. 1 to 3) having a MOS capacitor structure. The first N-type collector region 221 and the gate 232 may act as the first terminal (111 of FIGS. 1 to 3) and the second terminal (112 of FIGS. 1 to 3) of the anti-fuse memory cell 110, respectively.

A program operation and a read operation of the anti-fuse nonvolatile memory device 200 may be achieved by a selective operation of the lateral NPN BJT 120 comprised of the first N-type collector region 221, the P-type well region 206 and the N-type emitter region 223. That is, if the lateral NPN BJT 120 is turned on, the program operation or the read operation of the anti-fuse nonvolatile memory device 200 may be executed. In contrast, if the lateral NPN BJT 120 is turned off, the program operation and the read operation of the anti-fuse nonvolatile memory device 200 may not be executed. The lateral NPN BJT 120 may be turned on or off according to base-emitter voltage between the word line WL and the bit line BL.

Figure 6:
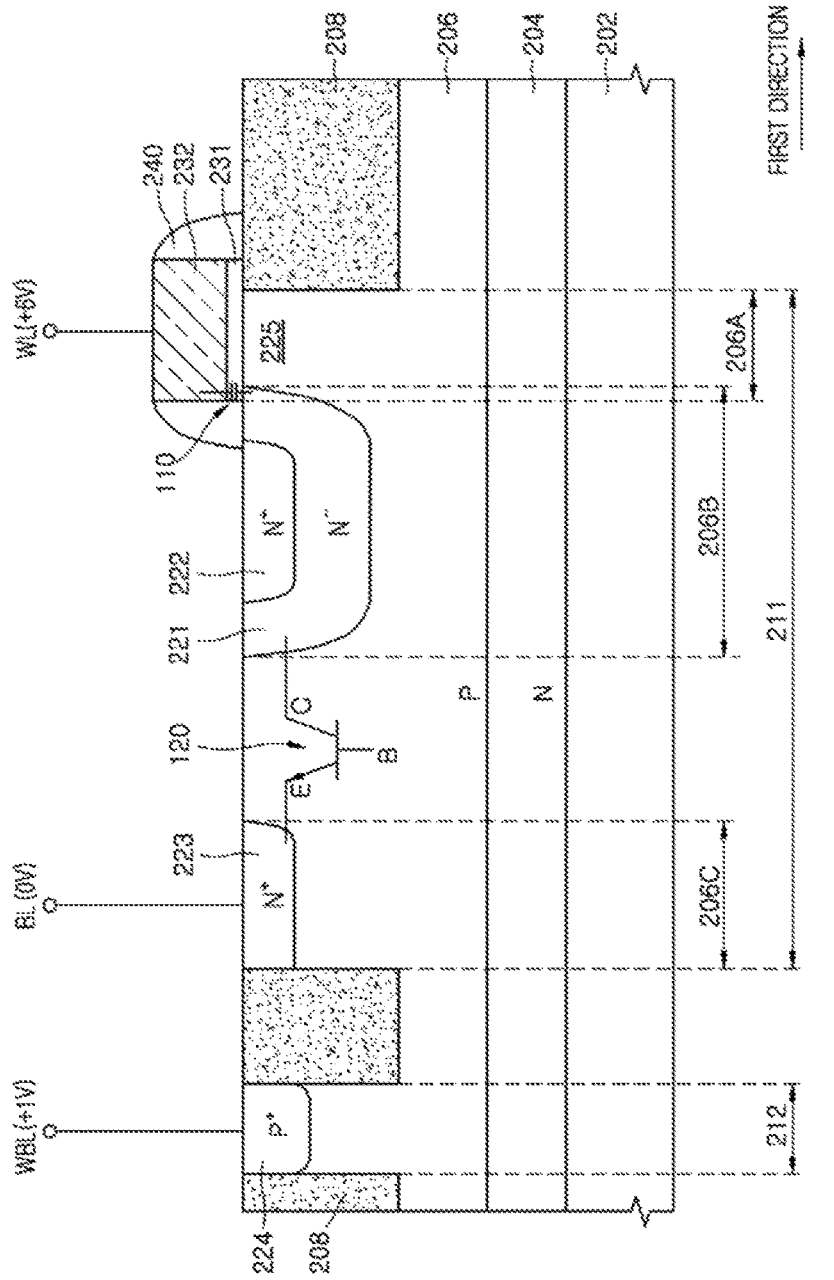
FIG. 6 is a cross-sectional view illustrating a program operation of the anti-fuse nonvolatile memory device shown in FIG. 4.

FIG. 6 is a cross-sectional view illustrating a program operation of the anti-fuse nonvolatile memory cell 110 included in the anti-fuse nonvolatile memory device 100 according to an embodiment. In FIG. 6, the same reference numerals or designators as used in FIG. 5 denote the same elements. Referring to FIG. 6, to program the anti-fuse nonvolatile memory cell 110, a positive program voltage +Vpp of +6 volts may be applied to the word line WL and a positive program base voltage +Vpbb of +1 volt may be applied to the well bias line WBL. In addition, a ground voltage may be applied to the bit line BL. That is, the bit line BL may be grounded. Although not shown in FIG. 6, the same voltage as the positive program base voltage +Vpbb, for example, +1 volt may be applied to the N-type deep well region 204. Although not shown in FIG. 6, an N-type inversion layer may be formed in the channel region 225 since the positive program voltage +Vpp of +6 volts is applied to the word line WL. While the positive program voltage +Vpp of +6 volts is applied to the word line WL, the voltage level of the first and second N-type collector regions 221 and 222 may be boosted. If the voltage level of the first and second N-type collector regions 221 and 222 is boosted to become higher than the positive program base voltage +Vpbb applied to the well bias line WBL, for example, +1 volt, the base-collector junction (B-C) junction of the lateral NPN BJT 120 may be reverse-biased and the base-emitter (B-E) junction of the lateral NPN BJT 120 may be forward-biased. Under the above bias condition, the lateral NPN BJT 120 may operate in an active mode to generate a collector current. Electrons causing the collector current may penetrate the anti-fuse insulation layer 231 due to a tunneling mechanism. While the electrons causing the collector current penetrate the anti-fuse insulation layer 231, the anti-fuse insulation layer 231 may be broken to provide current path disposed between the first N-type collector region 221 and the gate 232.

Figure 7:
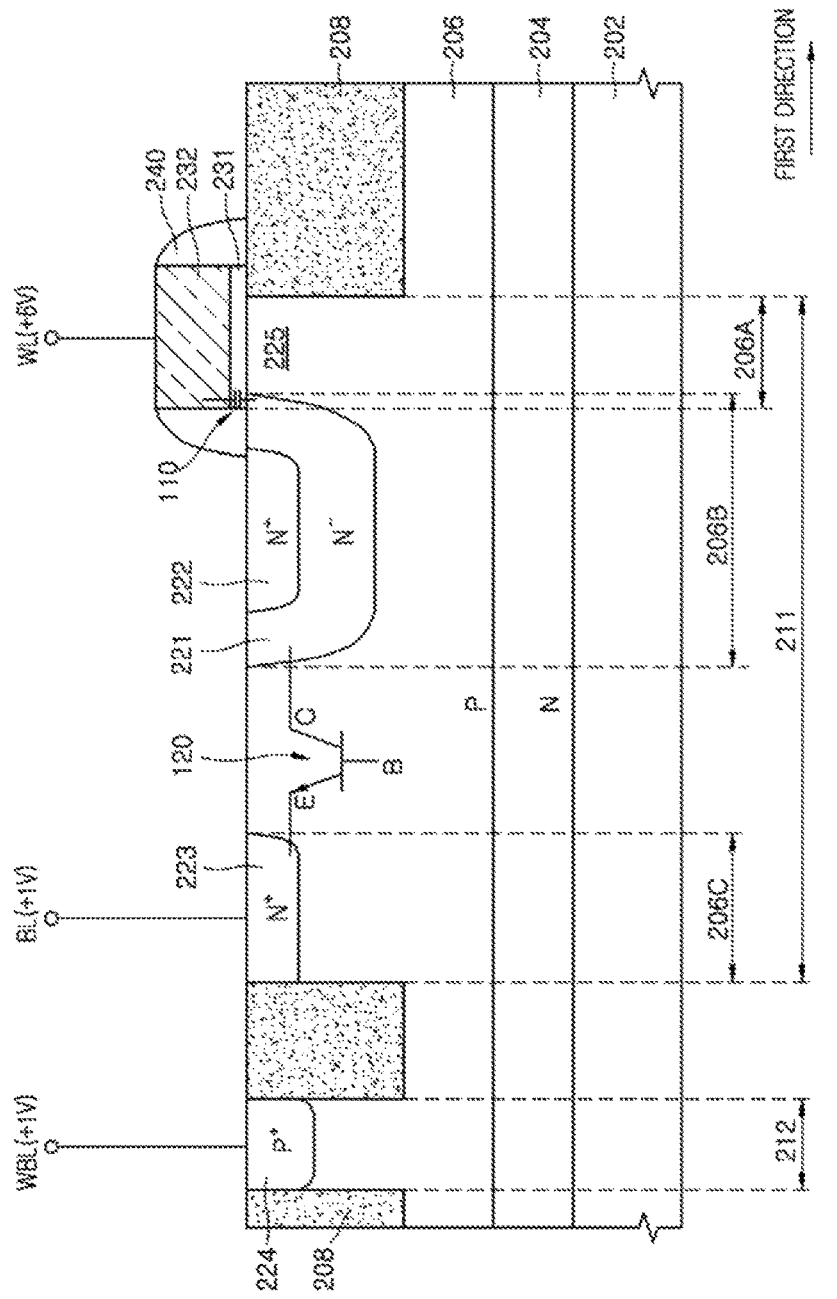
FIG. 7 is a cross-sectional view illustrating a program inhibition operation of the anti-fuse nonvolatile memory device shown in FIG. 4.

FIG. 7 is a cross-sectional view illustrating an example of a program inhibition operation of the anti-fuse nonvolatile memory cell 110 included in the anti-fuse nonvolatile memory device according to an embodiment. In FIG. 7, the same reference numerals or designators as used in FIG. 5 denote the same elements. Referring to FIG. 7, for preventing the anti-fuse, nonvolatile memory cell 110 from being programmed, the positive program voltage +Vpp of +6 volts may be applied to the word line WL and the positive program base voltage +Vpbb of +1 volt may be applied to both of the well bias line WBL and the bit line BL. Although not shown in FIG. 7, the same voltage as the positive program base voltage +Vpbb, for example, +1 volt may be applied to the N-type deep well region 204. Although not shown in FIG. 7, an N-type inversion layer may be formed in the channel region 225 since the positive program voltage +Vpp of +6 volts is applied to the word line WL. While the positive program voltage +Vpp of +6 volts is applied to the word line WL, the voltage level of the first and second N-type collector regions 221 and 222 may be boosted. If the voltage level of the first and second N-type collector regions 221 and 222 is boosted to become higher than the positive program base voltage +Vpbb for example, +1 volt applied to the well bias line WBL, the base-collector junction (B-C) junction of the lateral NPN BJT 120 may be reverse-biased. However, there is no voltage difference between the P-type well region 206 that is, the base region B and the N-type emitter region 223 since the positive program base voltage +Vpbb of +1 volt is applied to both of the P-type well region 206 and the N-type emitter region 223 through the well bias line WBL and the bit line BL. Thus, since the lateral NPN BJT 120 does not operate in an active mode, no collector current may flow. As a result, the anti-fuse insulation layer 231 is not broken preventing the anti-fuse nonvolatile memory cell 110 from being programmed.

Figure 8:
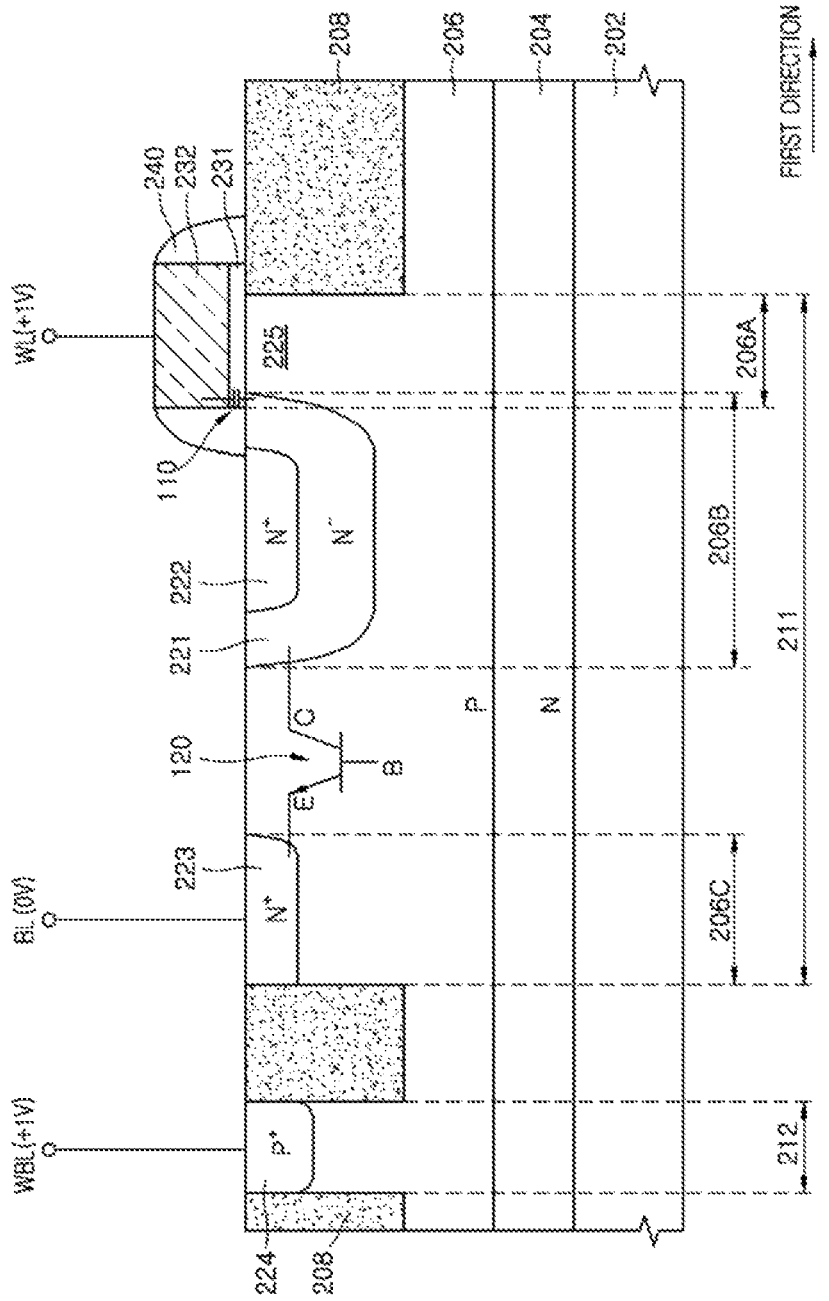
FIG. 8 is a cross-sectional view illustrating another program inhibition operation of the anti-fuse nonvolatile memory device shown in FIG. 4.

FIG. 8 is a cross-sectional view illustrating another example of a program inhibition operation of the anti-fuse, nonvolatile memory cell 110 included in the anti-fuse nonvolatile memory device. In FIG. 8, the same reference numerals or designators as used in FIG. 5 denote the same elements. Referring to FIG. 8, for preventing the anti-fuse nonvolatile memory cell 110 from being programmed, a voltage of +1 volt may be applied to the well bias line WBL and a ground voltage may be applied to the bit line BL. The same voltage that is, 1 volt as the voltage applied to the well bias line WBL may be applied to the word line WL. Although not shown in FIG. 8, the same voltage that is, 1 volt as the voltage applied to the well bias line WBL may be applied to the N-type deep well region 204. Under the above bias condition, the base-emitter junction (B-E) junction of the lateral NPN BJT 120 may be forward-biased but a voltage induced at the first and second N-type collector regions 221 and 222 by the voltage that is, +1 volt applied to the word line WL may be lower than a voltage which is capable of generating a collector current. Thus, the lateral NPN BJT 120 is not turned on and no collector current may flow. As a result, the anti-fuse insulation layer 231 is not broken and prevents the anti-fuse nonvolatile memory cell 110 from being programmed.

Figure 9:
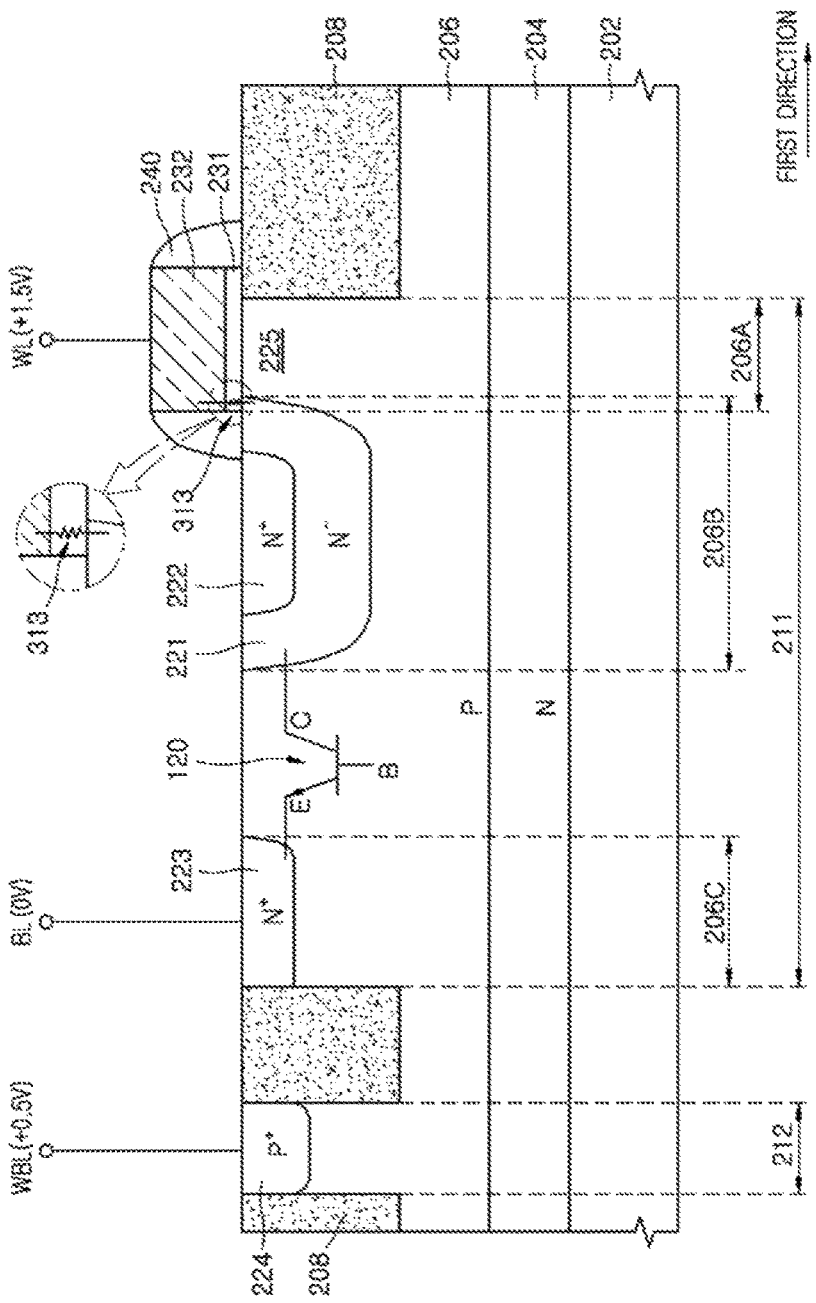
FIG. 9 is a cross-sectional view illustrating a read operation of the anti-fuse nonvolatile memory device shown in FIG. 4.

FIG. 9 is a cross-sectional view illustrating a read operation of the anti-fuse nonvolatile memory cell 110 included in the anti-fuse nonvolatile memory device according to an embodiment. In FIG. 9, the same reference numerals or designators as used in FIG. 5 denote the same elements. Referring to FIG. 9, for reading out information stored in the anti-fuse nonvolatile memory cell 110, a positive read voltage +Vrr of +1.5 volts may be applied to the word line WL and a positive read base voltage +Vrbb of +0.5 volts may be applied to the well bias line WBL. In addition, a ground voltage 0V may be applied to the bit line BL. That is, the bit line BL may be grounded. Although not shown in FIG. 9, the same voltage that is, 0.5 volts as applied to the well bias line WBL may also be applied to the N-type deep well region 204. Although not shown in FIG. 9, an N-type inversion layer may be formed in the channel region 225 since the positive voltage of +1.5 volts is applied to the word line WL. While the positive voltage of +1.5 volts is applied to the word line WL, the voltage level of the first and second N-type collector regions 221 and 222 may be boosted. If the voltage level of the first and second N-type collector regions 221 and 222 is boosted to become higher than the positive voltage that is, +0.5 volts applied to the well bias line WBL, the base-collector junction (B-C) junction of the lateral NPN BJT 120 may be reverse-biased. In such a case, a base current of the lateral NPN BJT 120 may increase, and a PN diode comprised of the P-type well region 206, acting as the base region B, and the N-type emitter region 223 may be turned on to allow a collector current to flow.

Under the above read bias condition illustrated in FIG. 9, if the anti-fuse memory cell 110 is programmed to have a current path 313 between the first N-type collector region 221 and the gate 232, the collector current may flow through the current path 313. That is, the collector current may flow from the word line WL toward the collector terminal C, and an emitter current may flow from the emitter terminal E toward the bit line BL. Accordingly, a programmed status of the anti-fuse memory cell 110 may be read out by sensing the emitter current flowing through the bit line BL. Although not shown in FIG. 9, in the event that the anti-fuse memory cell 110 is not programmed to have an initial status without the current path 313, no current flows from the word line WL toward the bit line BL even though the anti-fuse nonvolatile memory cell 110 is under the read bias condition.

Figure 10:
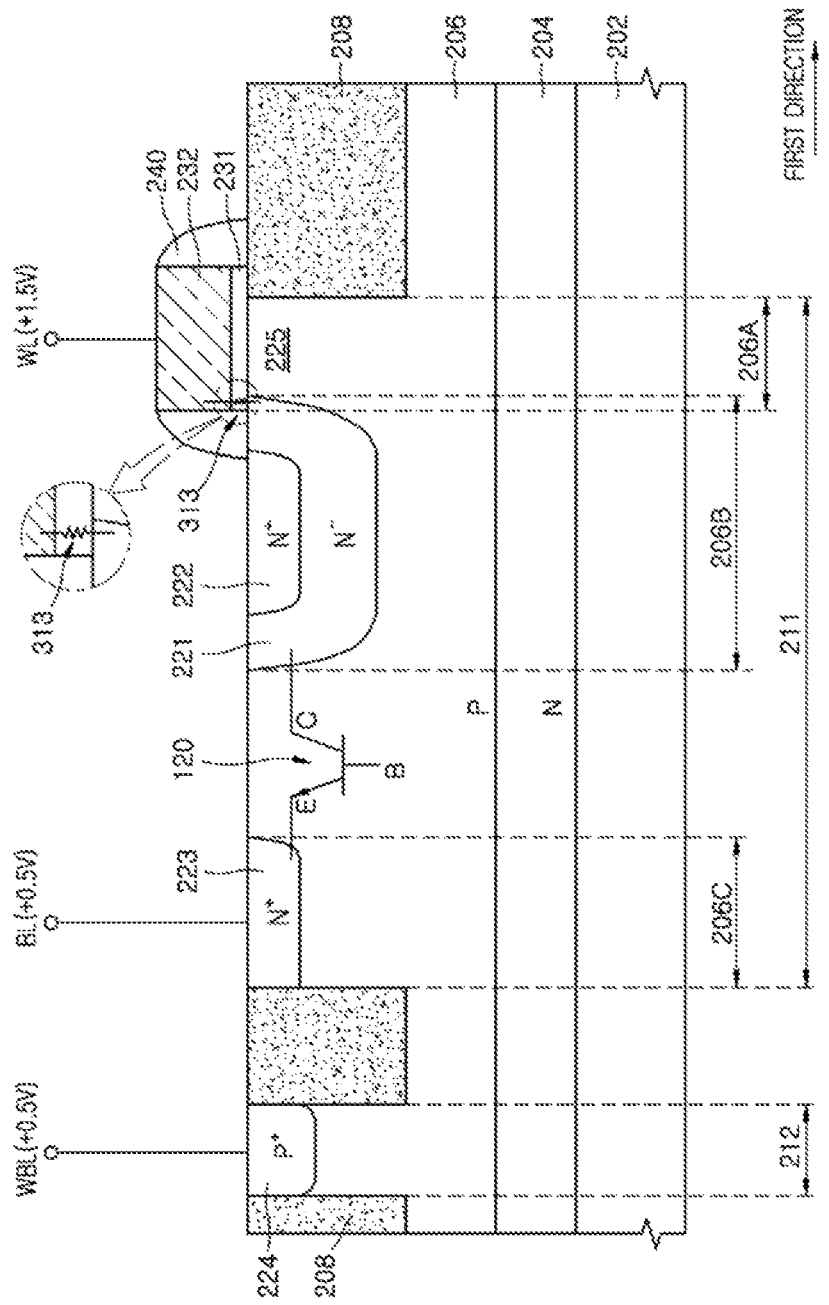
FIG. 10 is a cross-sectional view illustrating a read inhibition operation of the anti-fuse nonvolatile memory device shown in FIG. 4.

FIG. 10 is a cross-sectional view illustrating an example of a read inhibition operation of the anti-fuse, nonvolatile memory device 200 shown in FIGS. 4 and 5. In FIG. 10, the same reference numerals or designators as used in FIGS. 4 and 5 denote the same elements. Referring to FIG. 10, to prevent information stored in the anti-fuse nonvolatile memory device 200 from being read out, a voltage of +1.5 volts may be applied to the word line WL and a voltage of +0.5 volts may be applied to both of the well bias line WBL and the bit line BL. Although not shown in FIG. 10, the same voltage that is, +0.5 volts as applied to the well bias line WBL may also be applied to the N-type deep well region 204. Although not shown in FIG. 10, an N-type inversion layer may be formed in the channel region 225 since the positive voltage of +1.5 volts is applied to the word line WL. When the positive voltage of +1.5 volts is applied to the word line WL, the voltage level of the first and second N-type collector regions 221 and 222 may be boosted. If the voltage level of the first and second N-type collector regions 221 and 222 is boosted to become higher than the voltage that is, +0.5 volts, applied to the well bias line WBL, the base-collector junction (B-C) junction of the lateral NPN BJT 120 may be reverse-biased. However, there is no voltage difference between the P-type well region 206 that is, the base region B and the N-type emitter region 223 since the same voltage is applied to both of the P-type well region 206 and the N-type emitter region 223 through the well bias line WBL and the bit line BL. Thus, since the lateral NPN BJT 120 is not turned on, no collector current may flow. Accordingly, no emitter current may flow through the bit line BL regardless of whether the current path 313 exists in the anti-fuse insulation layer 231 between the first N-type collector region 221 and the gate 232.

Figure 11:
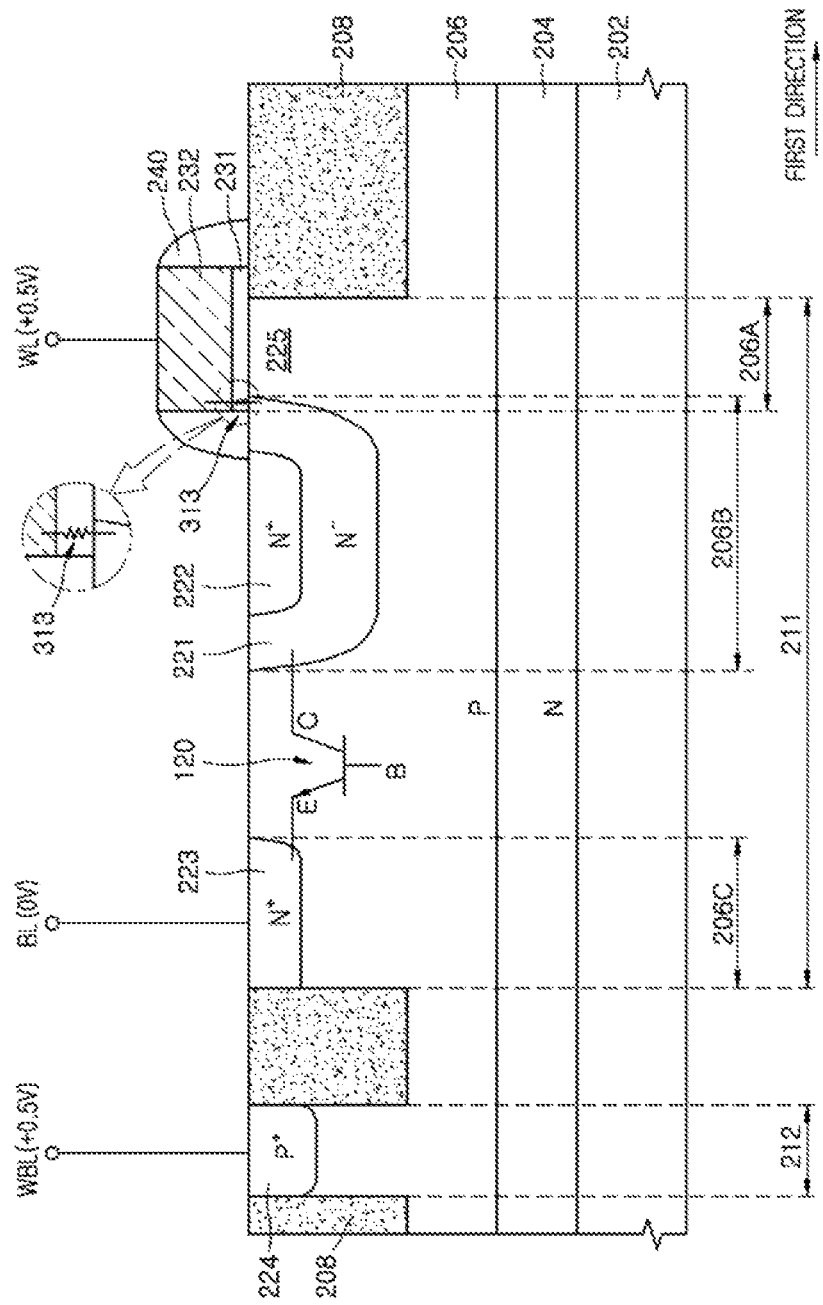
FIG. 11 is a cross-sectional view illustrating another read inhibition operation of the anti-fuse nonvolatile memory device shown in FIG. 4.

FIG. 11 is a cross-sectional view illustrating another example of the read inhibition operation of the anti-fuse, nonvolatile memory device 200 shown in FIGS. 4 and 5. In FIG. 11, the same reference numerals or designators as used in FIGS. 4 and 5 denote the same elements. Referring to FIG. 11, for preventing information stored in the anti-fuse, nonvolatile memory device 200 from being read out, a voltage of +0.5 volts may be applied to the well bias line WBL and a ground voltage 0V may be applied to the bit line BL. In addition, the same voltage that is, +0.5 volts as applied to the well bias line WBL may also be applied to the word line WL. Although not shown in FIG. 11, the same voltage that is, +0.5 volts as applied to the well bias line WBL may be applied to the N-type deep well region 204.

Under the above bias condition, a PN diode comprised of the P-type well region 206, acting as the base region B, and the N-type emitter region 223 is not turned on since the voltage of +0.5 volts applied to the word line WL is low. Thus, no collector current of the lateral NPN BJT 120 may flow. As a result, no emitter current may flow through the bit line BL regardless of whether the current path 313 exists in the anti-fuse insulation layer 231 between the first N-type collector region 221 and the gate 232.

Figure 12:
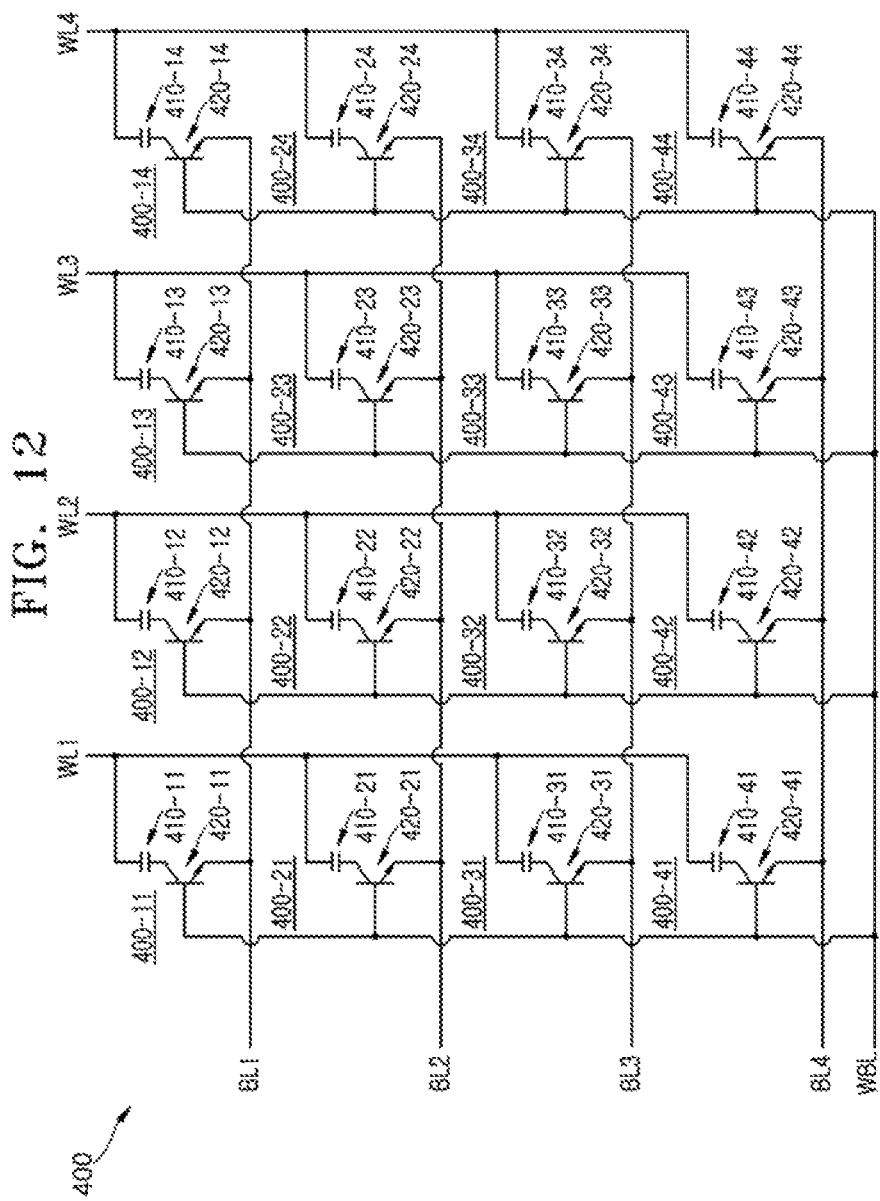
FIG. 12 is an equivalent circuit diagram illustrating a memory cell array of an anti-fuse nonvolatile memory device, according to an embodiment of the present disclosure.

FIG. 12 is an equivalent circuit diagram illustrating a memory cell array of an anti-fuse, nonvolatile memory device 400 according to an embodiment of the present disclosure. Referring to FIG. 12, the anti-fuse, nonvolatile memory device 400 may include a plurality of word lines WL1~WL4 respectively arrayed in four rows and a plurality of bit lines BL1~BL4 respectively arrayed in four columns. The rows and the columns may be arbitrarily set. For example, in some embodiments, the word lines WL1~WL4 may be respectively arrayed in four columns whereas the bit lines BL1~BL4 may be respectively arrayed in four rows. Although FIG. 12 illustrates an example in which the number of the word lines is four and the number of the bit lines is four, the present disclosure is not limited thereto. That is, in some embodiments, the number of the word lines may be less than or greater than four and the number of the bit lines may also be less than or greater than four. A plurality of anti-fuse, memory cell units 400-11, . . . , 400-14, 400-21, . . . , 400-24, 400-31 . . . , 400-34, 400-41, . . . , and 400-44 may be located at cross points of the rows for example, the bit lines BL1~BL4 and the columns for example, the word lines WL1~WL4, respectively. Each of the anti-fuse memory cell units 400-11, . . . , 400-14, 400-21, . . . , 400-24, 400-31 . . . , 400-34, 400-41, . . . , and 400-44 may have the same configuration as the anti-fuse, nonvolatile memory device 100 described with reference to FIG. 1. For example, the anti-fuse memory unit cell 400-11 located at a cross point of a first row and a first column may be configured to include an anti-fuse, memory cell 410-11 and a BJT 420-11 which are coupled in series.

The first word line WL1 may be coupled to second terminals of the anti-fuse, memory cells 410-11, 410-21, 410-31 and 410-41 included in the respective anti-fuse, memory cell units 400-11, 400-21, 400-31 and 400-41 arrayed in the first column. The second word line WL2 may be coupled to second terminals of the anti-fuse memory cells 410-12, 410-22, 410-32 and 410-42 included in the respective anti-fuse, memory cell units 400-12, 400-22, 400-32 and 400-42 arrayed in the second column. The third word line WL3 may be coupled to second terminals of the anti-fuse memory cells 410-13, 410-23, 410-33 and 410-43 included in the respective anti-fuse, memory cell units 400-13, 400-23, 400-33 and 400-43 arrayed in the third column. The fourth word line WL4 may be coupled to second terminals of the anti-fuse memory cells 410-14, 410-24, 410-34 and 410-44 included in the respective anti-fuse, memory cell units 400-14, 400-24, 400-34 and 400-44 arrayed in the fourth column.

The first bit line BL1 may be coupled to emitter terminals of the BJTs 420-11, 420-12, 420-13 and 420-14 included in the respective anti-fuse memory cell units 400-11, 400-12, 400-13 and 400-14 arrayed in the first row. The second bit line BL2 may be coupled to emitter terminals of the BJTs 420-21, 420-22, 420-23 and 420-24 included in the respective anti-fuse, memory cell units 400-21, 400-22, 400-23 and 400-24 arrayed in the second row. The third bit line BL3 may be coupled to emitter terminals of the BJTs 420-31, 420-32, 420-33 and 420-34 included in the respective anti-fuse, memory cell units 400-31, 400-32, 400-33 and 400-34 arrayed in the third row. The fourth bit line BL4 may be coupled to emitter terminals of the BJTs 420-41, 420-42, 420-43 and 420-44 included in the respective anti-fuse, memory cell units 400-41, 400-42, 400-43 and 400-44 arrayed in the fourth row.

A well bias line WBL may be coupled to base terminals of all of the BJTs 420-11, . . . , 420-14, 420-21, . . . , 420-24, . . . , 420-31, . . . , 420-34, 420-41, . . . , and 420-44 included in the respective anti-fuse memory cell units 400-11, . . . , 400-14, 400-21, . . . , 400-24, 400-31 . . . , 400-34, 400-41, . . . , and 400-44.

Figure 13:
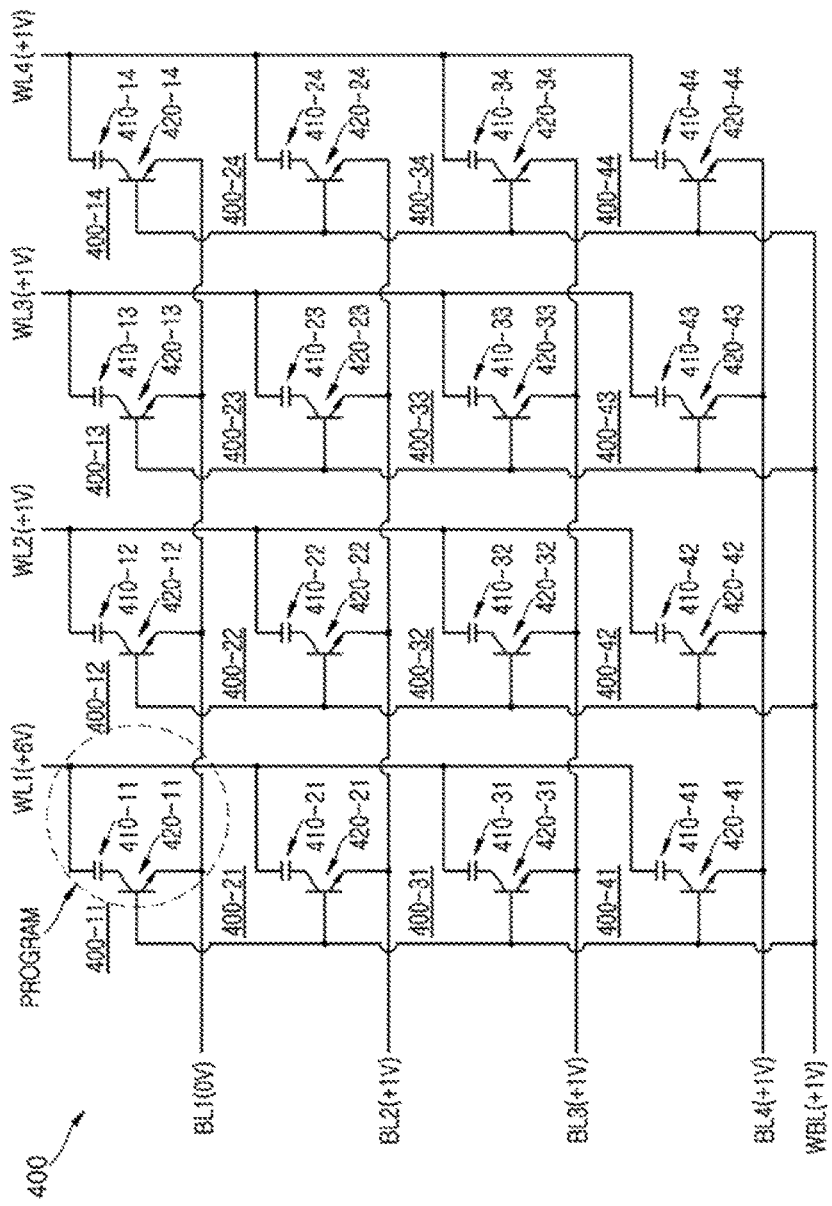
FIG. 13 is an equivalent circuit diagram illustrating a program operation of a selected memory cell in the anti-fuse nonvolatile memory cell array shown in FIG. 12.

FIG. 13 is an equivalent circuit diagram illustrating a program operation of a selected memory cell in the anti-fuse, nonvolatile memory device 400 shown in FIG. 12. In FIG. 13, the same reference numerals or designators as used in FIG. 12 denote the same elements. FIG. 13 illustrates an example in which the anti-fuse memory unit cell 400-11, hereinafter, referred to as a selected unit cell, located at a cross point of the first row and the first column is selectively programmed. To program the selected unit cell 400-11, a positive program voltage of +6 volts may be applied to the first word line WL1 coupled to the selected unit cell 400-11 and a ground voltage 0V may be applied to the first bit line BL1 coupled to the selected unit cell 400-11. In addition, a positive program base voltage of +1 volt may be applied to the well bias line WBL, and substantially the same voltage that is, +1 volt as the positive program base voltage may also be applied to the remaining word lines WL2, WL3 and WL4. Moreover, substantially the same voltage that is, +1 volt as the positive program base voltage may be applied to the remaining bit lines BL2, BL3 and BL4. Under the above bias condition, the BJT 420-11 of the selected unit cell 400-11 may have a forward-biased, base-emitter (B-E) junction and a reverse-biased, base-collector (B-C) junction, as described with reference to FIG. 6. Thus, the BJT 420-11 may operate in an active mode, and the selected unit cell 400-11 may be programmed.

While the selected unit cell 400-11 is programmed, there is no voltage difference between the base terminal and the emitter terminal of each of the BJTs 420-21, 420-31 and 420-41 included in the anti-fuse, memory cell units 400-21, 400-31 and 400-41 that share the first word line WL1 with the selected unit cell 400-11, as described with reference to FIG. 7. Thus, even though the base-collector (B-C) junctions of the BJTs 420-21, 420-31 and 420-41 are reverse-biased, the BJTs 420-21, 420-31 and 420-41 are not turned on and prevent the anti-fuse, memory cell units 400-21, 400-31 and 400-41 from being programmed.

Moreover, when the selected unit cell 400-11 is programmed, no collector current can flow in each of the BJTs 420-12, 420-13 and 420-14 since +1 volt is applied to the word lines WL2, WL3 and WL4 respectively coupled to the anti-fuse, memory cell units 400-12, 400-13 and 400-14 that share the first bit line BL1 with the selected unit cell 400-11, as described with reference to FIG. 8. Thus, the anti-fuse memory cell units 400-12, 400-13 and 400-14 may not be programmed.

Furthermore, there is no voltage difference between the base terminal and the emitter terminal of each of the BJTs 420-22, 420-23, 420-24, 420-32, 420-33, 420-34, 420-42, 420-43 and 420-44. Thus, all of the BJTs 420-22, 420-23, 420-24, 420-32, 420-33, 420-34, 420-42, 420-43 and 420-44 are turned off. Accordingly, the anti-fuse, memory cell units 400-22, 400-23, 400-24, 400-32, 400-33, 400-34, 400-42, 400-43 and 400-44 that do not share any of the first word line WL1 and the first bit line BL1 with the selected unit cell 400-11 are not programmed.

Figure 14:
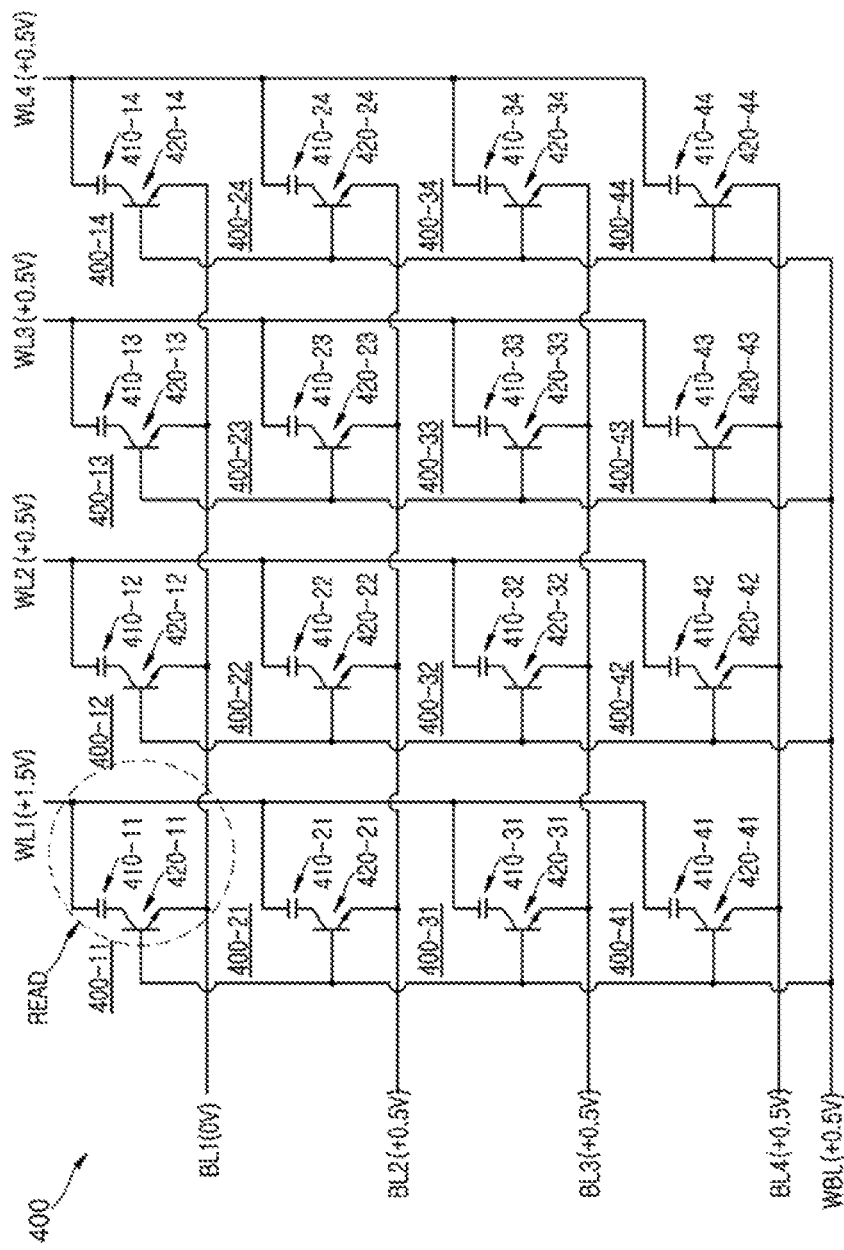
FIG. 14 is an equivalent circuit diagram illustrating a read operation of a selected memory cell in the anti-fuse nonvolatile memory cell array shown in FIG. 12.

FIG. 14 is an equivalent circuit diagram illustrating a read operation of a selected memory cell in the anti-fuse, nonvolatile memory device 400 shown in FIG. 12. In FIG. 14, the same reference numerals or designators as used in FIG. 12 denote the same elements. FIG. 14 illustrates an example in which information stored in the anti-fuse, memory unit cell 400-11 (hereinafter, referred to as a selected unit cell, located at a cross point of the first row and the first column is selectively read out. To read the selected unit cell 400-11, a positive read voltage of +1.5 volts may be applied to the first word line WL1 coupled to the selected unit cell 400-11 and a ground voltage may be applied to the first bit line BL1 coupled to the selected unit cell 400-11. In addition, a positive read base voltage of +0.5 volts may be applied to the well bias line WBL, and substantially the same voltage that is, +0.5 volts as the positive read base voltage may also be applied to the remaining word lines WL2, WL3 and WL4. Moreover, substantially the same voltage that is, +0.5 volts as the positive read base voltage may be applied to the remaining bit lines BL2, BL3 and BL4. Under the above bias condition, the BJT 420-11 of the selected unit cell 400-11 may have a reverse-biased, base-collector (B-C) junction because the positive read voltage of +1.5 volts is applied to the first word line WL1 coupled to the selected unit cell 400-11, as described with reference to FIG. 9. In such a case, an amount of a base current of the BJT 420-11 may increase to turn on a PN diode comprised of the base-emitter (B-E) junction of the BJT 420-11. As a result, the BJT 420-11 may be turned on.

As the BJT 420-11 is turned on, an emitter current of the BJT 420-11 flowing through the first bit line BL1 coupled to the selected unit cell 400-11 may be determined according to whether the anti-fuse, memory cell 410-11 has a programmed status or an initial status. If the anti-fuse memory cell 410-11 has a programmed status, a collector current may flow through the anti-fuse, memory cell 410-11 coupled between the first word line WL1 and the collector terminal of the BJT 420-11. As a result, an emitter current may flow from the emitter terminal of the BJT 420-11 toward the first bit line BL1. In contrast, if the anti-fuse, memory cell 410-11 is not programmed, that is, if the anti-fuse, memory cell 410-11 has an initial status, no collector current may flow though the first word line WL1 and the BJT 420-11. As a result, when the anti-fuse, memory cell 410-11 has an initial status, no emitter current may flow from the emitter terminal of the BJT 420-11 towards the first bit line BL1. That is, the selected unit cell 400-11 may be regarded as a programmed cell if an emitter current flowing through the first bit line BL1 is sensed, and the selected unit cell 400-11 may be regarded as a non-programmed cell if no emitter current is sensed.

Under the above read bias condition, there is no voltage difference between the base terminal and the emitter terminal of each of the BJTs 420-21, 420-31 and 420-41 included in the anti-fuse, memory cell units 400-21, 400-31 and 400-41 that share the first word line WL1 with the selected unit cell 400-11, as described with reference to FIG. 10. Thus, even though the base-collector (B-C) junctions of the BJTs 420-21, 420-31 and 420-41 are reverse-biased, the BJTs 420-21, 420-31 and 420-41 may not operate in an active mode. Accordingly, the read operation of the selected unit cell 400-11 may be successfully performed regardless of whether the anti-fuse, memory cells 410-21, 410-31 and 410-41 have a programmed status or not.

Moreover, as described with reference to FIG. 11, a voltage difference of 0.5 volts may be applied between the base terminal and the emitter terminal of each of the BJTs 420-12, 420-13 and 420-14 included in the anti-fuse memory cell units 400-12, 400-13 and 400-14 that share the first bit line BL1 with the selected unit cell 400-11, and a positive voltage of +0.5 volts may be applied to the word lines WL2, WL3 and WL4. Thus, the BJTs 420-12, 420-13 and 420-14 are not turned on and prevent the anti-fuse memory cells 410-12, 410-13 and 410-14 from being programmed.

Furthermore, there is no voltage difference between the base terminal and the emitter terminal of each of the BJTs 420-22, 420-23, 420-24, 420-32, 420-33, 420-34, 420-42, 420-43 and 420-44 included in the anti-fuse memory cell units 400-22, 400-23, 400-24, 400-32, 400-33, 400-34, 400-42, 400-43 and 400-44 that do not share any of the first word line WL1 and the first bit line BL1 with the selected unit cell 400-11. Thus, all of the BJTs 420-22, 420-23, 420-24, 420-32, 420-33, 420-34, 420-42, 420-43 and 420-44 may be turned off to prevent all of the anti-fuse memory cells 410-22, 410-23, 410-24, 410-32, 410-33, 410-34, 410-42, 410-43, 410-44 from being programmed.

Figure 15:
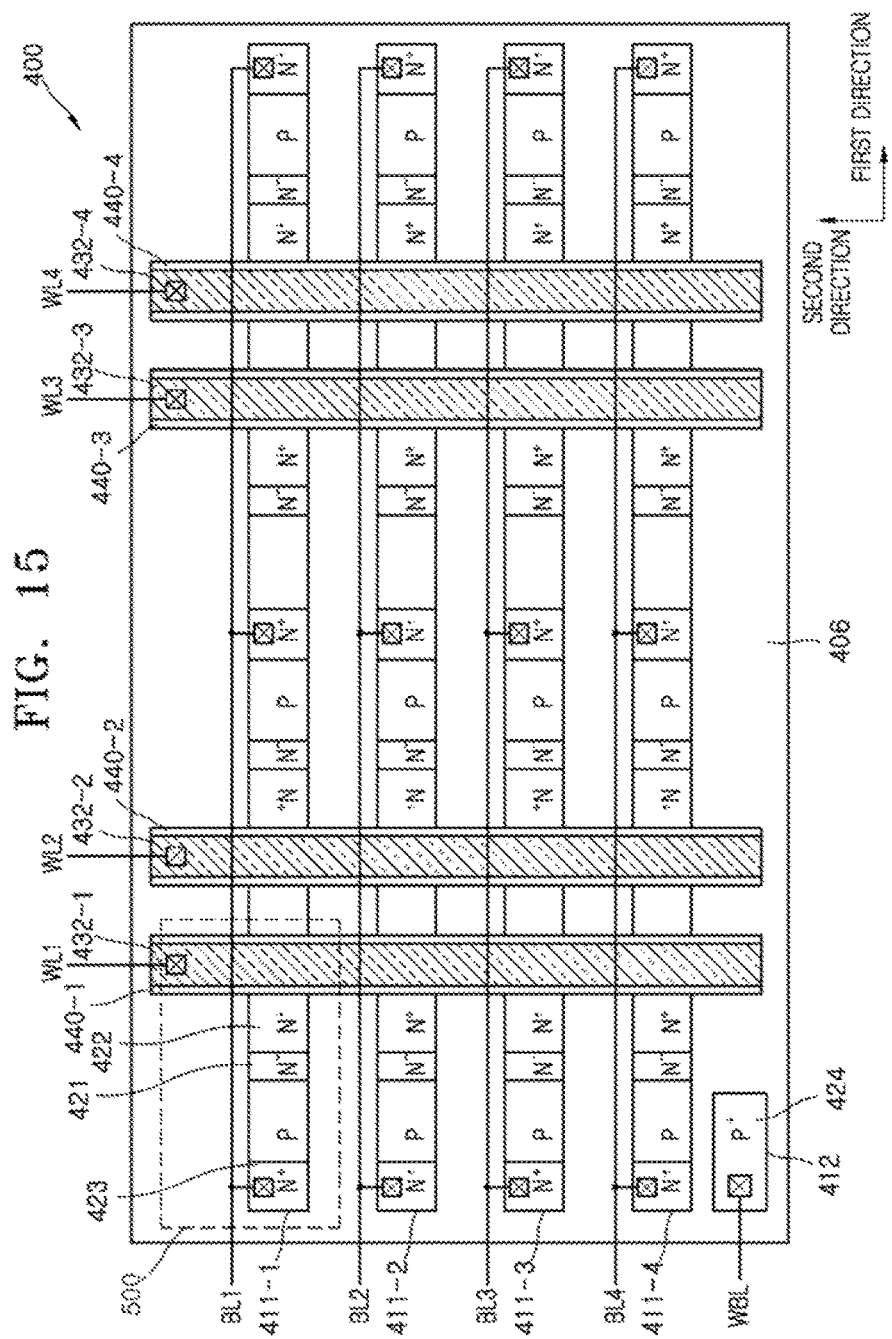
FIG. 15 is a layout diagram illustrating a memory cell array of an anti-fuse nonvolatile memory device, according to an embodiment of the present disclosure.

FIG. 15 is a layout diagram illustrating a memory cell array of the anti-fuse, nonvolatile memory device 400, according to an embodiment of the present disclosure. Referring to FIG. 15, the anti-fuse, nonvolatile memory device 400 may include first to fourth active regions 411-1, 411-2, 411-3 and 411-4 disposed in a P-type well region 406. The first to fourth active regions 411-1, 411-2, 411-3 and 411-4 may extend in a first direction, FIRST DIRECTION. The first to fourth active regions 411-1, 411-2, 411-3 and 411-4 may be spaced apart from each other in a second direction intersecting the first direction. In the illustrated embodiment, the second direction is substantially perpendicular to the second direction, however, the invention is not limited in this way. Although not shown in FIG. 15, the first to fourth active regions 411-1, 411-2, 411-3 and 411-4 may be defined by a trench isolation layer. A fifth active region 412 may be disposed in the P-type well region 406. A P-type contact region 424 may be disposed in the fifth active region 412. The P-type contact region 424 may be coupled to a well bias line WBL.

First to fourth gates 432-1, 432-2, 432-3 and 432-4 may intersect the first to fourth active regions 411-1, 411-2, 411-3 and 411-4. That is, the first to fourth gates 432-1, 432-2, 432-3 and 432-4 may extend in the second direction. The first to fourth gates 432-1, 432-2, 432-3 and 432-4 may be spaced apart from each other in the first direction. Although not shown in FIG. 15, the first gate 432-1 may be insulated from the first to fourth active regions 411-1, 411-2, 411-3 and 411-4 by a first anti-fuse insulation layer, and the second gate 432-2 may be insulated from the first to fourth active regions 411-1, 411-2, 411-3 and 411-4 by a second anti-fuse insulation layer. Similarly, the third gate 432-3 may be insulated from the first to fourth active regions 411-1, 411-2, 411-3 and 411-4 by a third anti-fuse insulation layer, and the fourth gate 432-4 may be insulated from the first to fourth active regions 411-1, 411-2, 411-3 and 411-4 by a fourth anti-fuse insulation layer. That is, the first anti-fuse insulation layer may be disposed between the first gate 432-1 and the first to fourth active regions 411-1, 411-2, 411-3 and 411-4, the second anti-fuse insulation layer may be disposed between the second gate 432-2 and the first to fourth active regions 411-1, 411-2, 411-3 and 411-4, the third anti-fuse insulation layer may be disposed between the third gate 432-3 and the first to fourth active regions 411-1, 411-2, 411-3 and 411-4, and the fourth anti-fuse insulation layer may be disposed between the fourth gate 432-4 and the first to fourth active regions 411-1, 411-2, 411-3 and 411-4. A first spacer 440-1 may be disposed on sidewalls of the first gate 432-1. Likewise, a second spacer 440-2 may be disposed on sidewalls of the second gate 432-2, a third spacer 440-3 may be disposed on sidewalls of the third gate 432-3, and a fourth spacer 440-4 may be disposed on sidewalls of the fourth gate 432-4. The first to fourth gates 432-1, 432-2, 432-3 and 432-4 may be coupled to first to fourth word lines WL1, WL2, WL3 and WL4, respectively. The first and second gates 432-1 and 432-2 may be adjacent to each other, and the third and fourth gates 432-3 and 432-4 may be adjacent to each other.

First N-type collector regions 421, second N-type collector regions 422 and N-type emitter regions 423 may be disposed in each of the first to fourth active regions 411-1, 411-2, 411-3 and 411-4. As described with reference to FIGS. 4 and 5, each of the first N-type collector regions 421 may be aligned with a sidewall of any one of the first to fourth gates 432-1, 432-2, 432-3 and 432-4. Each of the first N-type collector regions 421 may be disposed in any one of the second N-type collector regions 422. The N-type emitter region 423 and the first N-type collector region 421 disposed to be adjacent to each other in one of the first to fourth active regions 411-1, 411-2, 411-3 and 411-4 may be separated from each other by the P-type well region 406. The first N-type collector region 421 and the second N-type collector region 422 disposed in the first N-type collector region 421 may constitute a collector region of a lateral NPN BJT. The N-type emitter region 423 may act as an emitter region of the lateral NPN BJT. The P-type well region 406 between the first N-type collector region 421 and the N-type emitter region 423 may act as a base region of the lateral NPN BJT.

The anti-fuse, nonvolatile memory device 400 may include a plurality of anti-fuse, memory cell units 500 which are repeatedly arrayed in the first and second directions. Each of the anti-fuse, memory cell units 500 may have the same configuration as the anti-fuse, nonvolatile memory device 200 shown in FIG. 4. The N-type emitter region 423 disposed in the first active region 411-1 may be coupled to a first bit line BL1. The N-type emitter region 423 disposed in the second active region 411-2 may be coupled to a second bit line BL2. The N-type emitter region 423 disposed in the third active region 411-3 may be coupled to a third bit line BL3. The N-type emitter region 423 disposed in the fourth active region 411-4 may be coupled to a fourth bit line BL4. The first N-type collector region 421 and the second N-type collector region 422 may not be directly coupled to any signal lines to have a floating status. Although not shown in the drawings, a silicidation blocking pattern may be disposed on the first and second N-type collector regions 421 and 422.

According to the various embodiments described above, a program efficiency of anti-fuse, nonvolatile memory devices may be enhanced by employing lateral BJTs as selection transistors of anti-fuse, memory cell units. Also, the anti-fuse, nonvolatile memory devices may be realized using a logic process.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An anti-fuse nonvolatile memory device comprising:
an anti-fuse memory cell; and
a select transistor having a structure of bipolar junction transistor,
wherein the structure of bipolar junction transistor comprises;
   a well region of a first conductivity type acting as a base region, the well region having first, second and third upper portions, the third upper portion of the well region being spaced apart from the second upper portion of the well region;
   a first collector region of a second conductivity type disposed in the second upper portion of the well region, wherein an end of the second upper portion of the well region overlaps with an end of the first upper portion of the well region in a first direction;
   an emitter region of the second conductivity type disposed in the third upper portion of the well region; and
   a contact region of the first conductivity type disposed in the well region,
wherein the anti-fuse memory cell includes an anti-fuse insulation layer on a first upper portion of the well region and a gate stacked on the anti-fuse insulation layer; and
wherein the gate is coupled to a word line, the contact region is coupled to a well bias line, the emitter region is coupled to a bit line, and the first collector region is electrically floated.

2. The anti-fuse nonvolatile memory device of claim 1, wherein the first conductivity type is P-type and the second conductivity type is N-type.

3. The anti-fuse nonvolatile memory device of claim 1, wherein a portion of the first collector region vertically overlaps with a portion of the anti-fuse insulation layer and a portion of the gate.

4. The anti-fuse nonvolatile memory device of claim 1, wherein the first collector region and the emitter region are spaced apart from each other in the first direction along a surface of the well region.

5. The anti-fuse nonvolatile memory device of claim 1, further comprising a second collector region of the second conductivity type disposed in the first collector region, wherein an impurity concentration of the second collector region is higher than an impurity concentration of the first collector region.

* * * * *